(12) United States Patent
Bleeker et al.

(10) Patent No.: US 6,992,754 B2
(45) Date of Patent: *Jan. 31, 2006

(54) LITHOGRAPHIC APPARATUS AND DEVICE MANUFACTURING METHOD

(75) Inventors: Arno Jan Bleeker, Westerhoven (NL); Vadim Yevgenyevich Banine, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/019,215

(22) Filed: Dec. 23, 2004

(65) Prior Publication Data

US 2005/0117139 A1 Jun. 2, 2005

Related U.S. Application Data

(63) Continuation of application No. 10/613,218, filed on Jul. 7, 2003, now Pat. No. 6,864,958.

(30) Foreign Application Priority Data

Jul. 9, 2002 (EP) .................................. 02254786

(51) Int. Cl.
*G03B 27/54* (2006.01)
*G03B 27/42* (2006.01)
*G03F 1/00* (2006.01)

(52) U.S. Cl. ............................... 355/67; 355/53; 430/5
(58) Field of Classification Search .................. 355/52, 355/67–71; 430/5, 20, 22, 30; 359/224, 359/872
See application file for complete search history.

(56) References Cited

U.S. PATENT DOCUMENTS

| | | | |
|---|---|---|---|
| 5,870,176 A | 2/1999 | Sweatt et al. | |
| 6,188,519 B1 | 2/2001 | Johnson | |
| 6,301,000 B1 | 10/2001 | Johnson | |
| 6,329,738 B1 | 12/2001 | Hung et al. | |
| 6,544,698 B1 | 4/2003 | Fries | |
| 6,617,082 B2 | 9/2003 | Hutchinson | |
| 6,641,959 B2 * | 11/2003 | Yan ............................. | 430/5 |
| 6,864,958 B2 * | 3/2005 | Bleeker et al. ............... | 355/53 |
| 2003/0003372 A1 | 1/2003 | Hutchinson | |

FOREIGN PATENT DOCUMENTS

JP 2000-28931 1/2000

OTHER PUBLICATIONS

Choksi et al., "Maskless Extreme Ultraviolet Lithography," *Journal of Vacuum Science and Technology, Part B*, vol. 17, No. 6, Nov./Dec. 1999, pp. 3047-3051.

* cited by examiner

*Primary Examiner*—Henry Hung Nguyen
(74) *Attorney, Agent, or Firm*—Pillsbury Winthrop Shaw Pittman LLP

(57) ABSTRACT

A programmable patterning structure for use with a lithographic projection apparatus according to one embodiment of the invention includes a plurality of reflective elements A, B, C, each reflective element having two distributed Bragg reflectors 51, 52. A separation D1 between the two distributed Bragg reflectors is adjustable between a first relation, at which destructive interference between reflections from the first and second distributed Bragg reflectors 51, 52 results in substantially zero reflectivity, and a second relation, in which constructive interference between reflections from the first and second distributed Bragg reflectors 51, 52 results in high reflectivity.

31 Claims, 4 Drawing Sheets

LITHOGRAPHIC APPARATUS AND DEVICE MANUFACTURING METHOD

This is a continuation of U.S. patent application Ser. No. 10/613,218, filed Jul. 7, 2003 which is now U.S. Pat. No. 6,864,958, which claims priority to European Application No. 02254786.3, dated Jul. 9, 2002.

BACKGROUND OF THE INVENTION

1. Field of the Invention

This invention relates to lithographic apparatus and methods.

2. Background Information

The term "programmable patterning structure" as here employed should be broadly interpreted as referring to structure that may be used to endow an incoming radiation beam with a patterned cross-section, corresponding to a pattern that is to be created in a target portion of the substrate. The terms "light valve" and "spatial light modulator" may also be used in this context. Generally, such a pattern will correspond to a particular functional layer in a device being created in the target portion, such as an integrated circuit or other device (see below). Examples of such programmable patterning structure include:

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of very small (possibly microscopic) mirrors, each of which may be individually tilted about an axis by applying a suitable localized electric field, or by employing piezoelectric actuation means. The mirrors may be matrix-addressable, such that addressed mirrors will reflect an incoming radiation beam in a different direction with respect to unaddressed mirrors; in this manner, the reflected beam is patterned according to the addressing pattern of the matrix-addressable mirrors. The required matrix addressing can be performed using suitable electronic circuitry. In both of the situations described hereabove, the patterning structure can comprise one or more programmable mirror arrays. More information on mirror arrays as here referred to can be gleaned, for example, from U.S. Pat. Nos. 5,296,891 and 5,523,193, which are incorporated herein by reference, and PCT patent applications WO 98/38597 and WO 98/33096, which are incorporated herein by reference. In the case of a programmable mirror array, the support structure for the array may be embodied, for example, as a frame or table which is fixed or movable as required.

A programmable LCD array. An example of such a construction is given in U.S. Pat. No. 5,229,872, which is incorporated herein by reference. As above, the support structure in this case may be embodied, for example, as a frame or table which is fixed or movable as required.

For purposes of simplicity, the rest of this text may, at certain locations, specifically direct itself to examples involving a mask (or "reticle") and mask table; however, the general principles discussed in such instances should be seen in the broad context of the patterning structure as hereabove set forth.

Lithographic projection apparatus may be used, for example, in the manufacture of integrated circuits (ICs). In such a case, the patterning structure may generate a circuit pattern corresponding to an individual layer of the IC, and this pattern can be imaged onto a target portion (e.g., comprising one or more dies) on a substrate (e.g., a wafer of silicon or other semiconductor material) that has been coated with a layer of radiation-sensitive material (resist). In general, a single wafer will contain a network of adjacent target portions that are successively irradiated via the projection system (e.g., one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g., in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will be repeated for each new layer.

Eventually, an array of devices will be present on the substrate (wafer). The devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4.

The term "projection system" should be broadly interpreted as encompassing various types of projection system, including refractive optics, reflective optics, and catadioptric systems, for example. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices, the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

In order to meet the demand for forming ever-smaller components on the devices produced with lithographic projection apparatus, shorter wavelength radiation (such as EUV radiation) must be used. However, conventional programmable patterning structures may not be suitable for use with EUV radiation. For example, the surface tension in the multilayer stacks used to reflect EUV light is very high and may bend the elements in a conventional spatial light modulator.

SUMMARY OF THE INVENTION

In a lithographic apparatus according to one embodiment of the invention, a programmable patterning structure includes a plurality of reflective elements. Each reflective element includes upper and lower distributed Bragg reflectors having a separation relation selectable from among at least a first separation relation and a second separation relation. When the first separation relation is selected, the reflectivity of the reflective element is relatively low. When the second separation relation is selected, the reflectivity of the reflective element is relatively high.

In one such implementation, when the first separation relation is selected, the upper and lower distributed Bragg reflectors are relatively positioned such that reflections of the projection beam interfere destructively, and when the second separation relation is selected, the upper and lower distributed Bragg reflectors are relatively positioned such that reflections of the projection beam interfere constructively.

In a lithographic projection apparatus according to another embodiment of the invention, a programmable patterning structure includes a plurality of reflective elements, each having a distributed Bragg reflector. A position of each of a set of the reflective elements is selectably adjustable to create a phase difference between a reflection from the reflective element and a reflection from another of the plurality of reflective elements.

A device manufacturing method according to a further embodiment of the invention includes using programmable patterning structure to endow the projection beam with a desired pattern in its cross-section. The programmable patterning structure includes a plurality of reflective elements. Each reflective element includes upper and lower distributed Bragg reflectors having a separation relation selectable from among at least a first separation relation and a second separation relation. When the first separation relation is selected, the reflectivity of the reflective element is relatively low. When the second separation relation is selected, the reflectivity of the reflective element is relatively high.

Although specific reference may be made in this text to the use of an apparatus according to an embodiment of the invention in the manufacture of ICs, it should be explicitly understood that such an apparatus may have many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

In the present document, the terms "radiation" and "beam" are used to encompass all types of electromagnetic radiation, including ultraviolet radiation (e.g., with a wavelength of 365, 248, 193, 157 or 126 nm) and EUV (extreme ultra-violet radiation, e.g., having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION OF THE INVENTION

Embodiments of the present invention include a lithographic projection apparatus with programmable patterning structure suitable for use with EUV radiation.

Figure 1:
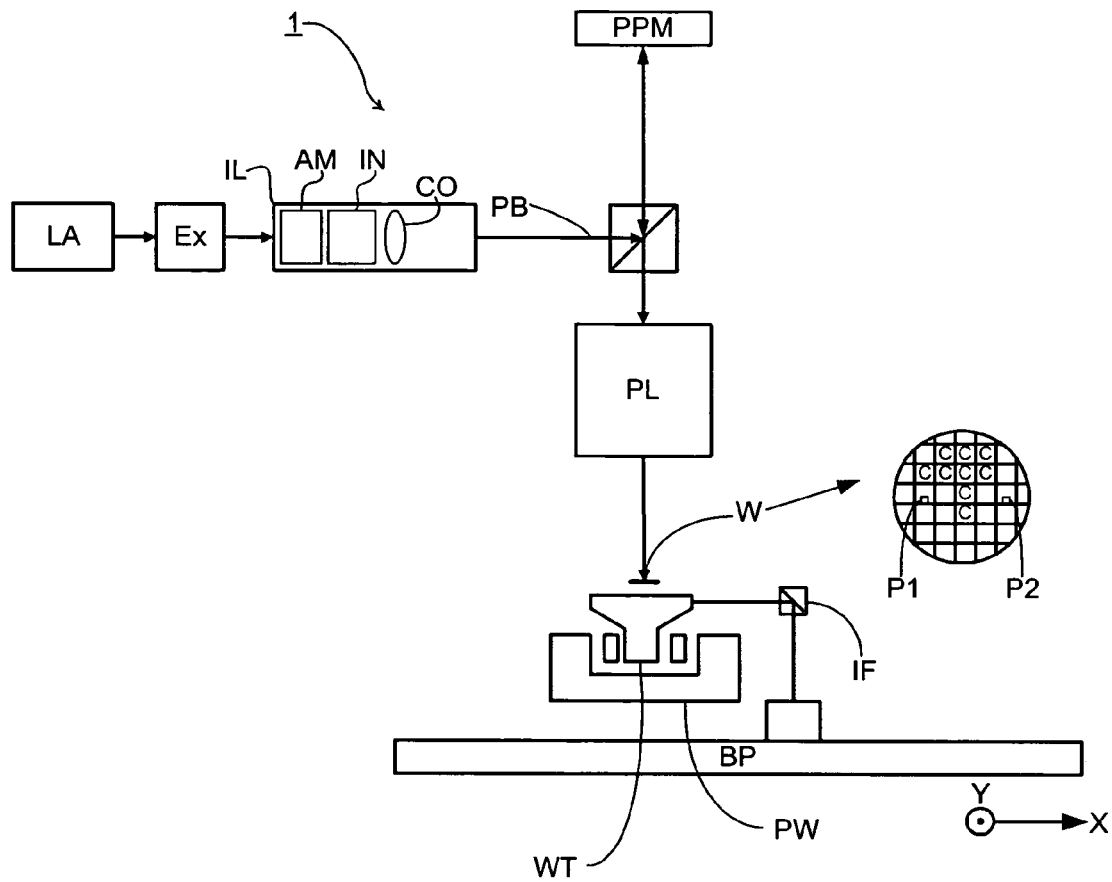
FIG. 1 depicts a lithographic projection apparatus according to an embodiment of the invention.

FIG. 1 schematically depicts a lithographic projection apparatus according to a particular embodiment of the invention. The apparatus comprises:

A radiation system configured to supply (e.g., having structure capable of supplying) a projection beam PB of radiation. In this particular example, the radiation system Ex, IL for supplying a projection beam PB of radiation (e.g., EUV radiation) also comprises a radiation source LA;

A support structure configured to support a patterning structure capable of patterning the projection beam. In this example, a first object table (mask table) MT is provided with a mask holder for holding a mask MA (e.g., a reticle), and is connected to a first positioning structure for accurately positioning the mask with respect to item PL;

A second object table (substrate table) configured to hold a substrate. In this example, substrate table WT is provided with a substrate holder for holding a substrate W (e.g., a resist-coated silicon wafer), and is connected to a second positioning structure for accurately positioning the substrate with respect to item PL; and A projection system ("lens") configured to project the patterned beam. In this example, projection system PL (e.g., a mirror group) is configured to image an irradiated portion of the mask MA onto a target portion C (e.g., comprising one or more dies) of the substrate W.

The source LA (e.g., a laser-produced or discharge plasma source, or an undulator provided around the path of an electron beam in a storage ring or synchrotron) produces a beam of radiation. The beam is fed into an illumination system (illuminator) IL, either directly or after having traversed conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g., with the aid of suitable directing mirrors). This latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning structure (and interferometric measuring means IF), the substrate table WT can be moved accurately, e.g., so as to position different target portions C in the path of the beam PB. Similarly, the first positioning structure can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at once (i.e., in a single "flash") onto a target portion C. The substrate table WT is then shifted in the x and/or y directions so that a different target portion C can be irradiated by the beam PB.

2. In scan mode, essentially the same scenario applies, except that a given target portion C is not exposed in a single "flash." Instead, the mask table MT is movable in a given direction (the so-called "scan direction," e.g., the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The programmable patterning structure according to one embodiment of the present invention includes a plurality of reflective elements arranged in a grid. For example, each reflective element may have a surface area of approximately 10 $\mu$m×10 $\mu$m, and the complete programmable patterning structure may have a surface area of approximately 25 mm×25 mm. In other implementations, the programmable patterning structure may include reflective elements having different aspect ratios and/or surface areas from one another.

Figure 2:
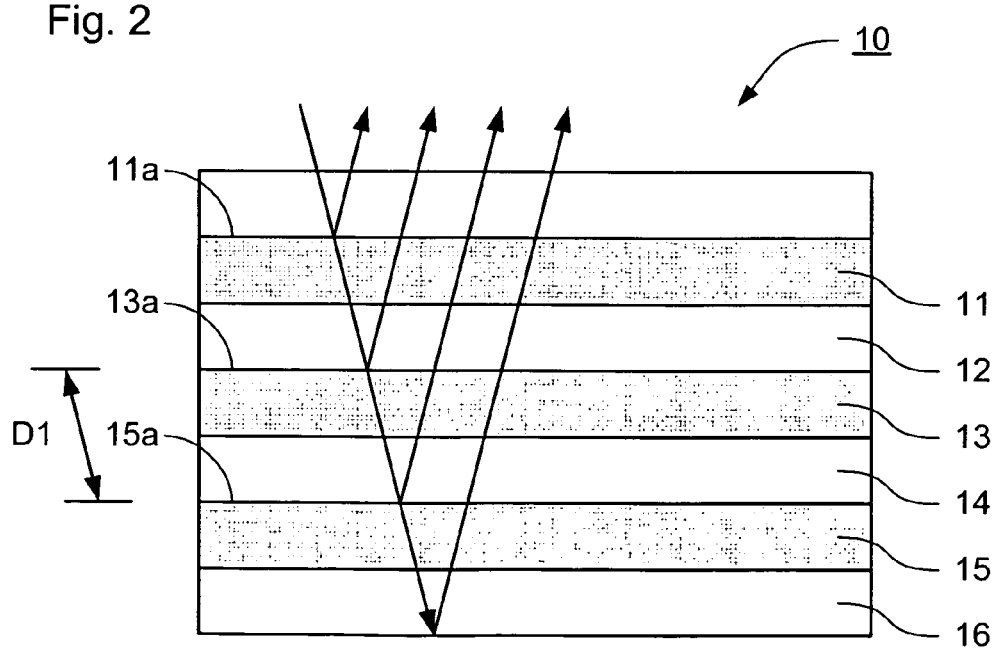
FIG. 2 depicts a distributed Bragg reflector suitable for use in the present invention.

FIG. 2 shows a distributed Bragg reflector suitable for use in an embodiment of the present invention. The distributed Bragg reflector is comprised of a multilayer stack 10. In a distributed Bragg reflector for use with EUV radiation, for example, the stack 10 may include layers 11, 13, 15 of molybdenum interposed with layers 12, 14, 16 of silicon. The high reflectivity (of approximately 70%) of the reflector occurs due to the constructive interference of the radiation reflected from the upper surfaces 11$a$, 13$a$, 15$a$ of the metal layers 11, 13, 15. In order to maximize the construction of this interference, the distance D1 between the upper surfaces 11$a$, 13, 15$a$ of the metal layers in the direction in which the radiation is directed (i.e., taking into account the angle of incidence) should be a multiple of half of the wavelength $\lambda$ of the radiation used (e.g., n$\lambda$/2, where n is an integer greater than zero). Although the distributed Bragg reflector in FIG. 2 is shown with three metal layers, it will be appreciated that in practice a much larger number of layers, for example 80 layers, may be used for optimum reflectivity. Further information on distributed Bragg reflectors may be found in European Patent Publications EP 1,065,532A and EP 1,065,568A, which documents are incorporated herein by reference.

Figure 3:
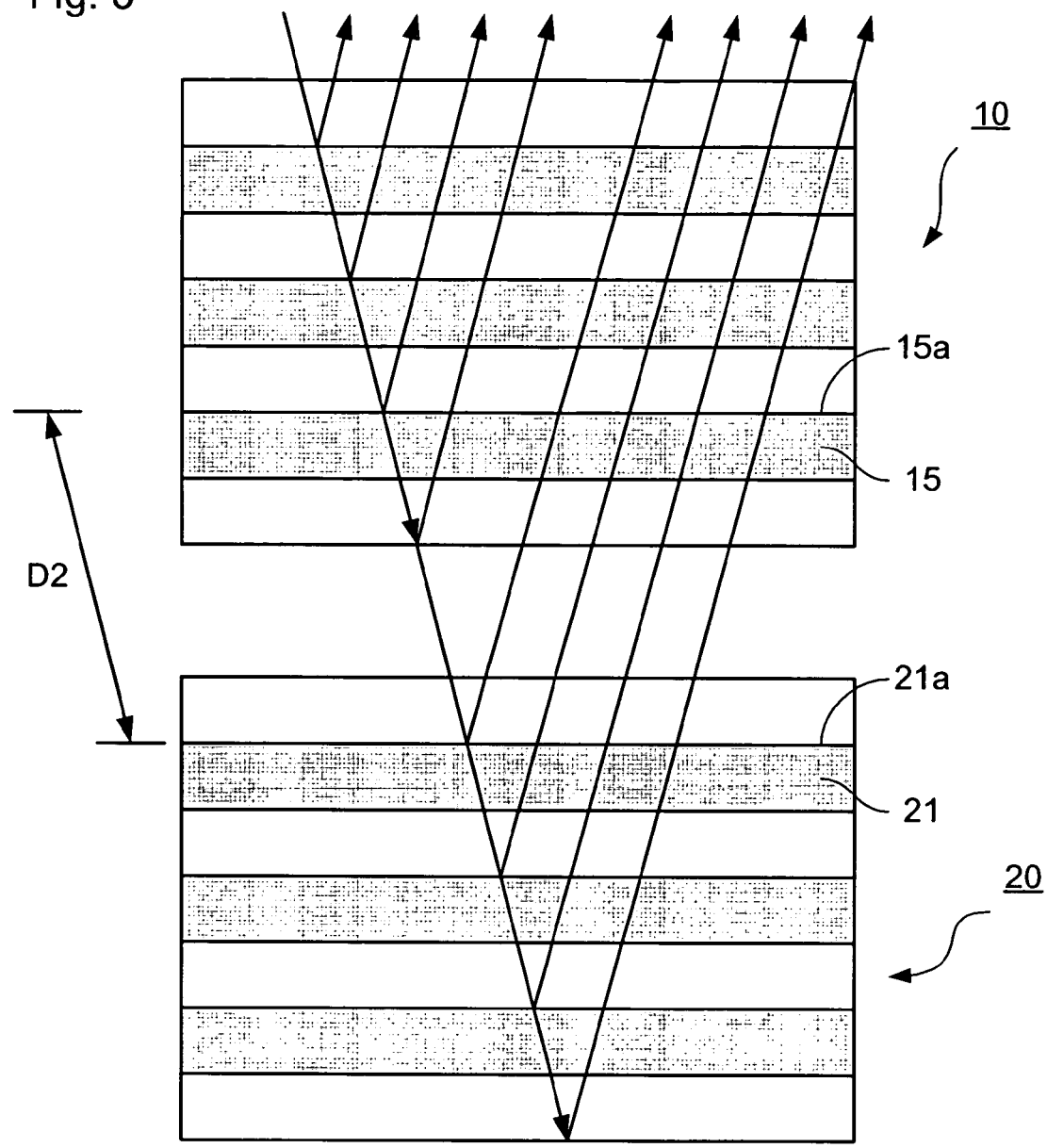
FIG. 3 depicts the use of two distributed Bragg reflectors to create an element with adjustable reflectivity.

FIG. 3 schematically represents a reflective element of a programmable mask according to an embodiment of the present invention. The programmable mask includes a plurality of reflective elements arranged on a surface onto which the projection beam of radiation is incident. Each reflective element may be individually controlled, such that by changing the reflectivity of some of the reflective elements, the beam reflected by the programmable mask contains a desired pattern in its cross-section.

Each reflective element includes two distributed Bragg reflectors 10, 20. When the distance D2 between the upper surfaces 15$a$, 21$a$ of the metal layers of the two distributed Bragg reflectors 10, 20 in the direction of the beam of radiation (i.e., taking account of the angle of incidence of the beam) is a multiple of half the wavelength of the beam of radiation, the reflections from the two distributed Bragg reflectors 10, 20 constructively interfere and the total reflection is at a maximum. When, however, the distributed Bragg reflectors 10, 20 are positioned such that the distance D2 is altered from the previous position by a quarter of the wavelength of the radiation, as shown in FIG. 3, then negative (i.e., destructive) interference between the reflection from the upper distributed Bragg reflector 10 and the reflection from the lower distributed Bragg reflector 20 will result in substantially zero reflectivity of the reflective element.

By adjusting the value of the distance D2 to be in between these two positions, intermediate levels of reflectivity between zero and the maximum can be attained. Preferably the distance D2 can be adjusted to any one of approximately 200 positions between the positions for the maximum and minimum reflectivity. Alternatively, the position of the distributed Bragg reflectors may be controlled to allow a continuous range of settings of distance D2.

Such an arrangement may be used to obtain a programmable patterning structure in which each reflective element may be controlled to switch between relatively high and relatively low reflectivity at a particular wavelength of radiation. Therefore, by setting different reflective elements to different states, the programmable patterning structure may impart the desired pattern to the beam.

A mask according to an embodiment of the invention may be positioned during use such that the upper distributed Bragg reflector of a reflective element is above a corresponding lower distributed Bragg reflector. Alternatively, as shown in FIG. 1, the mask may be positioned during use such that the upper distributed Bragg reflector of a reflective element is actually below a corresponding lower distributed Bragg reflector. Of course, the mask may be positioned in many other orientations as well. For example, the mask may be positioned sideways such that the upper and lower Bragg reflectors of a reflective element are neither above nor below each other.

An actuator may be used to adjust the separation of the upper and lower distributed Bragg reflectors in each reflective element according to one of a plurality of positions. For example, the actuator may set the reflectivity of the reflective element to be at a selected one of a plurality of levels between the first position, in which the reflectivity is substantially zero, and the second position, in which the reflectivity is a maximum. Such actuated control of a plurality of levels may facilitate better control of the pattern imparted to the projection beam.

In another implementation, two or more of the reflective elements have a common first distributed Bragg reflector. For example, such an arrangement may result in a programmable patterning structure that is more easily manufactured. In one such implementation, the reflectivity of a reflective element is set by moving the corresponding second distributed Bragg reflector relative to the common first distributed Bragg reflector.

In an exemplary implementation of a lithographic apparatus according to an embodiment of the invention, the projection beam of radiation is EUV radiation, and the distributed Bragg reflectors are designed to be individually reflective of EUV radiation at the wavelength used. Additionally, the difference in the separation of the first and second distributed Bragg reflectors between the positions of zero and maximum reflectivity is approximately one-quarter of the wavelength of the radiation used. Such an arrangement provides a greater degree of contrast between the reflective elements' maximum and minimum reflectivity.

Figure 4:
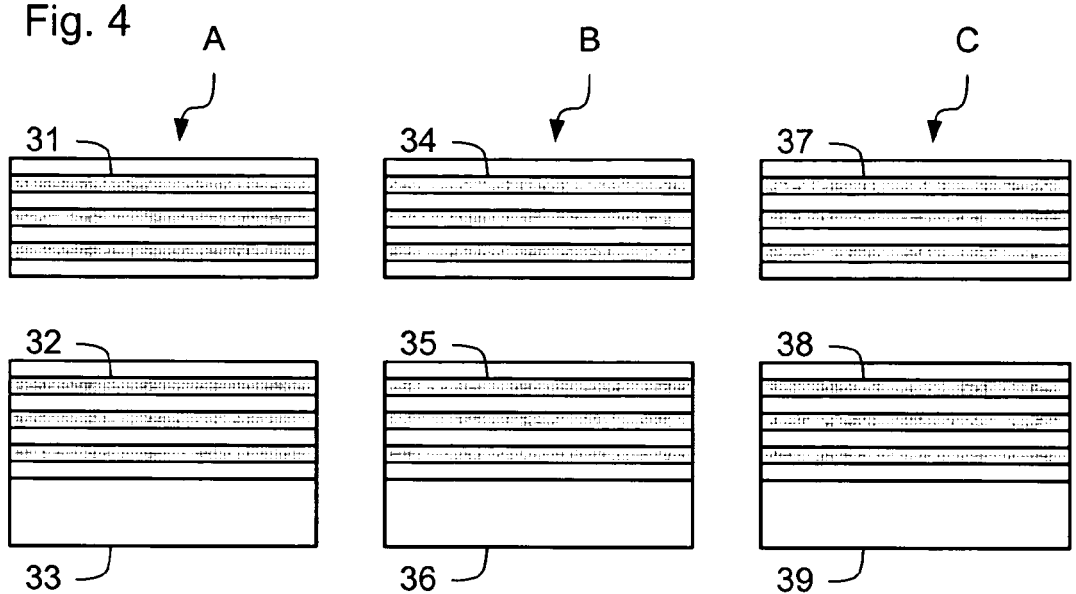
FIG. 4 depicts a portion of a programmable mask according to an embodiment of the present invention.

FIG. 4 schematically shows three reflective elements A, B, C of a programmable mask according to an embodiment of the present invention. Reflective element A includes two distributed Bragg reflectors 31, 32, as described before and a piezoelectric actuator 33. Similarly, reflective element B includes distributed Bragg reflectors 34, 35 and piezoelectric actuator 36, and reflective element C includes distributed Bragg reflectors 37, 38 and piezoelectric actuator 39. By applying appropriate voltages to the individual piezoelectric actuators 33, 36, 39, the position of the lower distributed Bragg reflectors 32, 35, 38 may be moved relative to the corresponding upper distributed Bragg reflectors 31, 34, 37, respectively, thereby altering the reflectivity of each of the reflective elements A, B, C.

As noted above, the separation of the upper and lower distributed Bragg reflectors may be adjusted using a piezoelectric actuator. The performance of such actuators is well understood, and it is possible to control the movement of such piezoelectric actuators to a very high level of accuracy. Such accuracy may be required since, for a typical EUV application, the range of movement of the piezoelectric actuator may be on the order of a few nanometers with a required accuracy in the sub-nanometer range. For example, to provide 10 grey levels between the first and second positions in such an application, the difference between the separation at adjacent positions may be approximately 0.2 to 0.5 nm.

As shown in FIG. 4, each of the reflective elements A, B, C has a discrete piezoelectric element 33, 36, 39, respectively. However, in another implementation, two or more of the reflective elements may have a common piezoelectric element. The piezoelectric effect is generally limited to a region immediately surrounding the voltage applied to a piezoelectric element. Therefore, by providing the voltage only to a region of the common piezoelectric element that corresponds to a particular reflective element, only the lower distributed Bragg reflector corresponding to that reflective element may be moved, thereby adjusting the reflectivity only of that reflective element. Thus, by attaching a plurality of electrodes to a single piezoelectric element that controls the positions of multiple lower distributed Bragg reflectors, a plurality of reflective elements sharing the piezoelectric element can be controlled.

Figure 5:
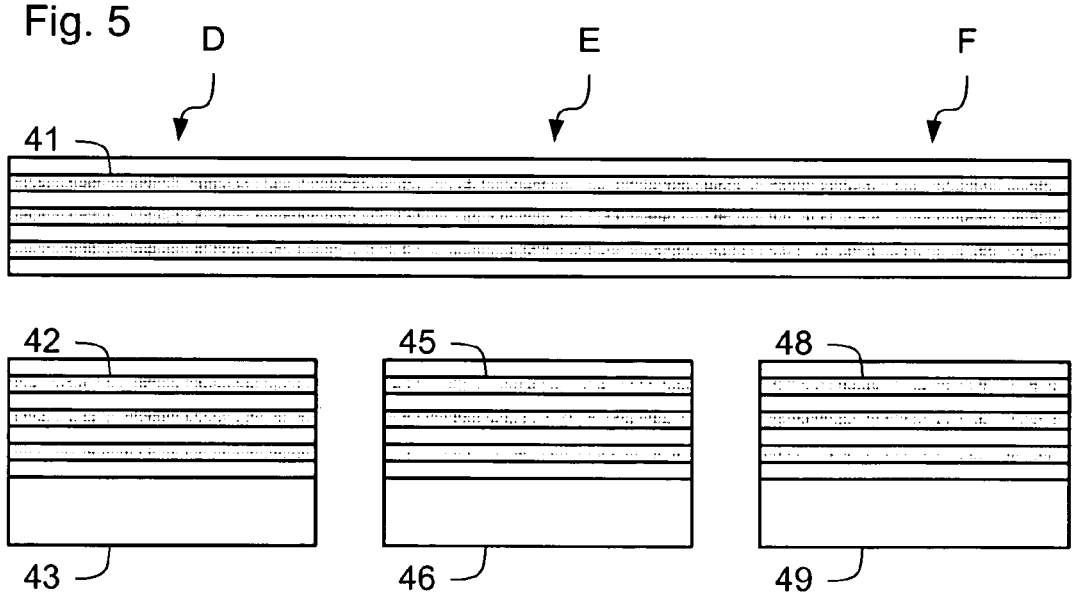
FIG. 5 depicts a portion of a further programmable mask according to an embodiment of the present invention.

FIG. 5 depicts a further variant of this embodiment. Each of the reflective elements D, E, F has its own lower distributed Bragg reflector 42, 45, 48, the position of which may be adjusted with corresponding piezoelectric actuators 43, 46, 49. In this case, however, the reflective elements D, E, F share a common upper distributed Bragg reflector 41. Depending on the size of the programmable mask, the upper distributed Bragg reflector 41 may be common to all the reflective elements in the programmable mask or just to a section of it. As before, two or more reflective elements may be arranged to share a common piezoelectric element. For example, using a common piezoelectric element may significantly simplify the production of a programmable patterning structure.

Figure 6:
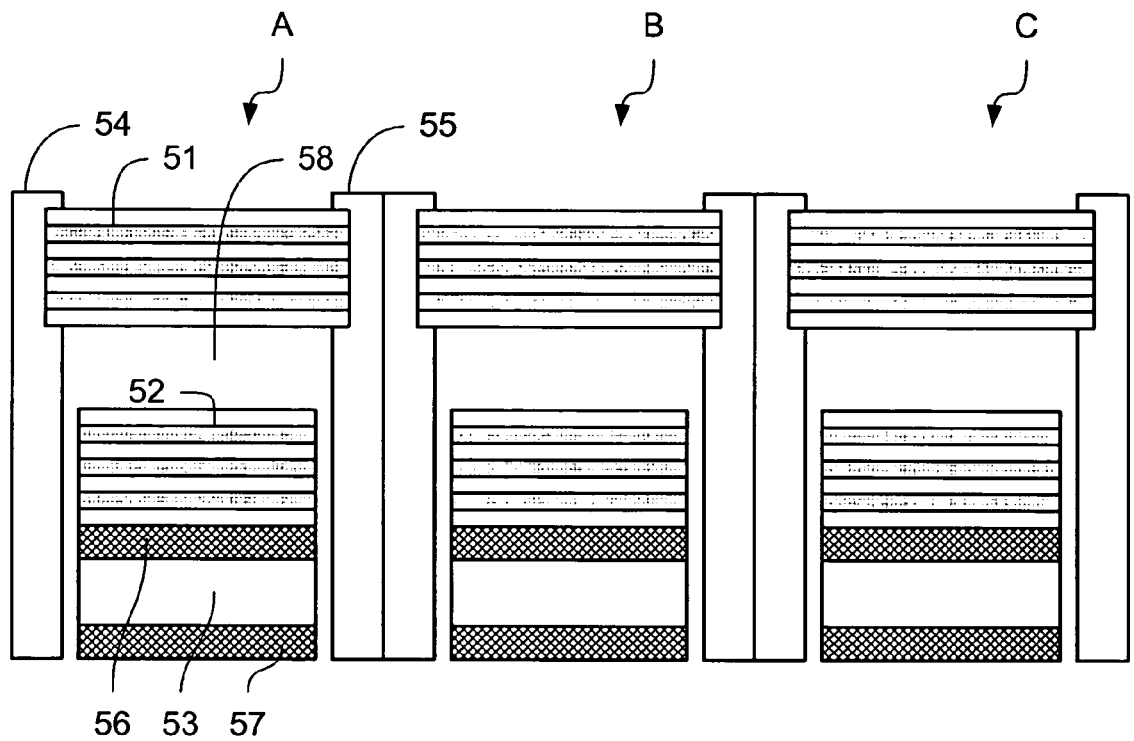
FIG. 6 depicts a portion of a piezoelectric-actuator-driven programmable mask according to an embodiment of the present invention.

FIG. 6 shows the embodiment of FIG. 4 in more detail. The upper distributed Bragg reflector 51 of each reflective element A, B, C is supported by supports 54, 55. As shown in FIG. 6, the supports may be columns between the reflective elements A, B, C. Alternatively, a mesh-like structure may be formed onto which the upper distributed Bragg reflectors 51 are placed. The lower distributed Bragg reflectors 52 are supported on a piezoelectric layer 53. The gap 58 between the upper and lower distributed Bragg reflectors may be filled with a porous material (provided it is substantially transparent to the beam of radiation) or may be a vacuum.

The piezoelectric element 53 has upper and lower electrodes 56, 57, respectively, to provide the voltage to actuate the piezoelectric actuators and thereby alter the size of the gap 58 between the upper and lower distributed Bragg reflectors. The upper electrode layer 56 may be common for all the reflective elements, the actuation signal being provided via the lower electrode layer 57. Alternatively, the lower distributed Bragg reflector may be used as the top electrode. As discussed before, the upper distributed Bragg reflector and/or the piezoelectric element (or portions thereof) may be common for some or all of the reflective elements.

As a further alternative, the separation of the upper and lower distributed Bragg reflectors may be adjusted by electrostatic actuation. Such an arrangement may reduce the complexity of the programmable patterning structure and facilitate its manufacture, for example, using such actuation in place of piezoelectric elements.

Figure 7:
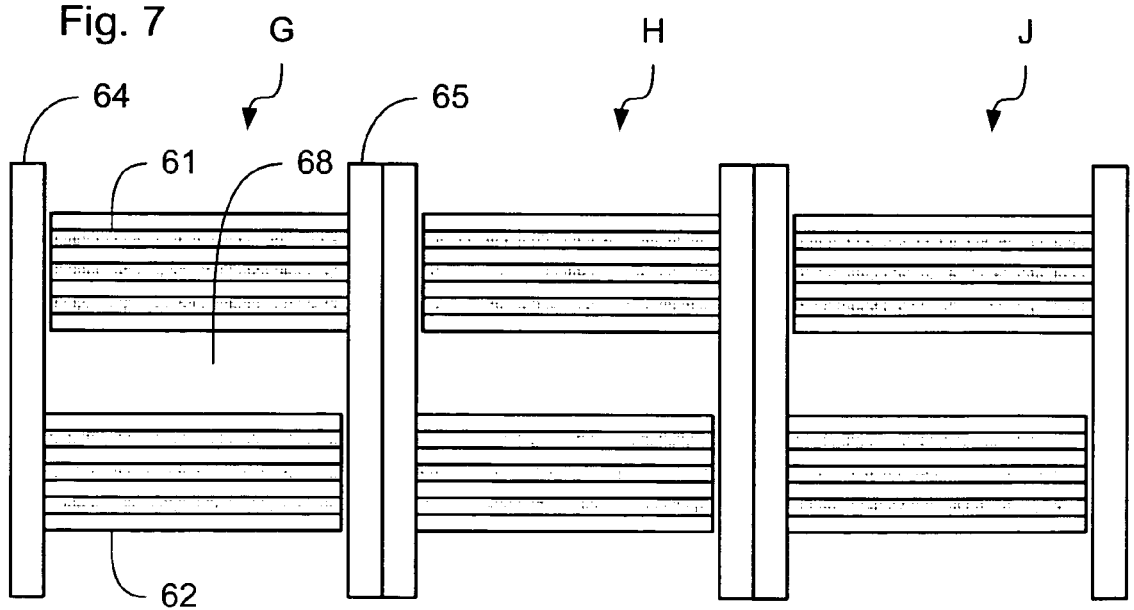
FIG. 7 depicts a portion of an electrostatic-actuator-driven programmable mask according to an embodiment of the present invention.

FIG. 7 depicts an alternative embodiment of the present invention in which the upper and lower distributed Bragg reflectors 61, 62 are used as electrodes to adjust the distance between the distributed Bragg reflectors using electrostatic attraction. In one such arrangement, the support 64, 65 is used to provide the signals to the distributed Bragg reflectors, and the gap 68 between the distributed Bragg reflectors is electrically non-conductive. As above, the gap 68 may be a vacuum or may be filled with a porous (and substantially transparent) material.

In a particular arrangement as shown in FIG. 7, as the electrostatic force between the two distributed Bragg reflectors 61, 62 increases, the supports 64, 65 bend, varying the separation between the distributed Bragg reflectors.

A potential advantage of using electrostatic actuation is that such actuation may be implemented to operate at potentials lower than the tens of volts that may be needed to produce a required movement of piezoelectric elements.

Whilst specific embodiments of the invention have been described above, it will be appreciated that the invention as claimed may be practiced otherwise than as described. It is explicitly noted that the description of these embodiments is not intended to limit the invention as claimed.

What is claimed is:

1. A programmable patterning structure configured to pattern a beam of radiation, the programmable patterning structure comprising:
    a plurality of reflective elements, each reflective element including a distributed Bragg reflector,
    wherein the programmable patterning structure includes at least one piezoelectric element configured to adjust a position of at least one of a set of the plurality of reflective elements to create a phase difference between a reflection from the at least one reflective element and a reflection from another of the plurality of reflective elements.

2. The structure of claim 1, wherein the piezoelectric element is configured to adjust a position of each of the set of the plurality of reflective elements between a first position and a second position,
    such that when the reflective element is in the first position, a reflection from the reflective element interferes destructively with a reflection from another of the plurality of reflective elements, and
    such that when the reflective element is in the second position, a reflection from the reflective element interferes constructively with a reflection from the other of the plurality of reflective elements.

3. The structure of claim 1, wherein a difference in the distance between a reflecting layer of the reflective element and a reflecting layer of the other of the plurality of reflective elements between the first and second positions is substantially equal to one-quarter of a wavelength of the beam of radiation.

4. The structure of claim 1, wherein the piezoelectric element is configured to adjust a position of each of the set of the plurality of reflective elements between the first position, the second position, and at least one position between the first and second positions.

5. The structure of claim 1, wherein said piezoelectric element is common to at least two of the plurality of reflective elements,
    wherein each of said at least two reflective elements includes an electrode configured to apply a signal to cause a piezoelectric effect in the piezoelectric element that is substantially local to the reflective element.

6. The structure of claim 5, wherein a common electrode is disposed on one side of the piezoelectric element, said common electrode being common to the at least two reflective elements, and wherein the electrode of each of the said at least two reflective elements is disposed on a second side of the piezoelectric element, said second side being opposite to said first side.

7. The structure of claim 1, wherein the Bragg reflectors include a multilayer stack of Silicon and Molybdenum.

8. The structure of claim 1, wherein a gap separating the at least one of a set of the plurality of reflective elements from the other of the plurality of reflective elements is filled with a porous material that is substantially transparent at a wavelength of said radiation beam.

9. The structure of claim 1, wherein said structure is configured to continuously adjust a gap separating the at least one of a set of the plurality of reflective elements from the other of the plurality of reflective elements.

10. The structure of claim 1, wherein each of the Bragg reflectors has a substantially square shape.

11. The structure of claim 1, wherein each reflective element includes an upper and lower distributed Bragg reflectors and wherein each of the lower distributed Bragg reflectors includes a piezoelectric element.

12. The structure of claim 1, wherein the piezoelectric element includes an electrode arranged on one side of the piezoelectric element.

13. The structure of claim 1, wherein each piezoelectric element includes an upper and a lower electrode that are disposed on opposite sides of the piezoelectric element.

14. A programmable patterning structure configured to pattern a beam of radiation, the programmable patterning structure comprising:
    a plurality of reflective elements, each reflective element including upper and lower distributed Bragg reflectors having a separation relation selectable from among at least a first separation relation and a second separation relation, and
    an actuator configured to set a separation relation of at least one of the reflective elements to one of the first separation relation, the second separation relation, and at least one separation relation between the first and second separation relations,
    wherein, when the first separation relation is selected, a reflectivity of the reflective element at a wavelength of the beam of radiation is relatively low, and when the second separation relation is selected, a reflectivity of the reflective element at a wavelength of the beam of radiation is relatively high, and
    wherein the actuator includes a piezoelectric element.

15. The structure of claim 14, wherein at least two among the plurality of reflective elements have a common distributed Bragg reflector.

16. The structure of claim 15, wherein the common distributed Bragg reflector is configured to be locally distortable such that a selected position of the common distributed Bragg reflector differs between the at least two among the plurality of reflective elements.

17. The structure of claim 14, wherein, when the first separation relation is selected, the upper and lower distributed Bragg reflectors are relatively positioned such that reflections of the beam of radiation interfere destructively, and wherein, when the second separation relation is selected, the upper and lower distributed Bragg reflectors are relatively positioned such that reflections of the beam of radiation interfere constructively.

18. The structure of claim 14, wherein at least two of the plurality of reflective elements have a common upper distributed Bragg reflector.

19. The structure of claim 14, wherein a difference in the distance between a reflecting layer of the upper distributed Bragg reflector and a reflecting layer of the lower distributed Bragg reflector between the first and second separation relations is substantially equal to one-quarter of a wavelength of the beam of radiation.

20. The structure of claim 14, wherein the piezoelectric element is common to a set including at least two of the reflective elements, and wherein each reflective element of the set includes an electrode configured to apply a signal to cause a piezoelectric effect in the piezoelectric element that is substantially local to the reflective element.

21. The structure of claim 20, wherein a common electrode is disposed on one side of the piezoelectric element, said common electrode being common to the at least two reflective elements, and wherein the electrode of each of the said at least two reflective elements is disposed on a second side of the piezoelectric element, said second side being opposite to said first side.

22. The structure of claim 14, wherein at least one of the plurality of reflective elements is configured to use an electrostatic force to adjust a separation relation between the upper and lower distributed Bragg reflectors.

23. The structure of claim 14, wherein the Bragg reflectors include a multilayer stack of Silicon and Molybdenum.

24. The structure of claim 14, wherein a gap separating the upper and lower distributed Bragg reflectors is filled with a porous material that is substantially transparent at a wavelength of said radiation beam.

25. The structure of claim 14, wherein said structure is configured to continuously adjust a gap separating the upper and lower distributed Bragg reflectors.

26. The structure of claim 14, wherein each of the Bragg reflectors has a substantially square shape.

27. The structure of claim 14, wherein each of the plurality of reflective elements is independently controlled to select the separation relation.

28. The structure of claim 14, wherein a relatively high reflectivity is about 70%.

29. The structure of claim 14, wherein each of the lower distributed Bragg reflectors includes a piezoelectric element.

30. The structure of claim 14, wherein each of the piezoelectric elements includes an electrode arranged on one side of the piezoelectric element.

31. The structure of claim 14, wherein each of the piezoelectric element includes an upper and a lower electrode that are disposed on opposite sides of the piezoelectric element.

* * * * *